United States Patent
Tu et al.

(10) Patent No.: US 8,581,283 B2
(45) Date of Patent: Nov. 12, 2013

(54) PHOTOELECTRIC DEVICE HAVING GROUP III NITRIDE SEMICONDUCTOR

(75) Inventors: Po-Min Tu, Hukou (TW); Shih-Cheng Huang, Hukou (TW); Wen-Yu Lin, Hukou (TW); Chih-Peng Hsu, Hukou (TW); Shih-Hsiung Chan, Hukou (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 168 days.

(21) Appl. No.: 13/015,590

(22) Filed: Jan. 28, 2011

(65) Prior Publication Data

US 2011/0114983 A1   May 19, 2011

Related U.S. Application Data

(60) Continuation-in-part of application No. 12/852,746, filed on Aug. 9, 2010, now abandoned, which is a division of application No. 12/426,010, filed on Apr. 17, 2009, now Pat. No. 7,824,942.

(30) Foreign Application Priority Data

Apr. 28, 2008 (TW) ................... 97115512 A

(51) Int. Cl.
*H01L 33/10* (2010.01)
(52) U.S. Cl.
USPC .................................. 257/98; 257/E33.023
(58) Field of Classification Search
USPC .............................. 257/98, E33.023, E33.068
See application file for complete search history.

(56) References Cited

U.S. PATENT DOCUMENTS

| | | | |
|---|---|---|---|
| 7,824,942 B2 * | 11/2010 | Tu et al. ........................... | 438/46 |
| 2001/0042866 A1 | 11/2001 | Coman et al. | |
| 2006/0065901 A1 * | 3/2006 | Aoyagi et al. .................. | 257/79 |
| 2007/0141741 A1 | 6/2007 | Suh et al. | |
| 2009/0085165 A1 | 4/2009 | Hiramatsu et al. | |
| 2009/0267097 A1 * | 10/2009 | Tu et al. ........................... | 257/98 |
| 2009/0278150 A1 | 11/2009 | Lee et al. | |
| 2009/0321780 A1 * | 12/2009 | Huang et al. .................. | 257/101 |
| 2011/0193115 A1 * | 8/2011 | Schellhammer et al. ........ | 257/94 |

FOREIGN PATENT DOCUMENTS

| | | |
|---|---|---|
| CN | 1262528 A | 8/2000 |
| JP | 2001-284314 A | 10/2001 |
| JP | 200355097 A | 2/2003 |
| JP | 2005-197289 A | 7/2005 |
| JP | 2005-210066 A | 8/2005 |
| JP | 2006-041491 A | 2/2006 |
| JP | 2006-316307 A | 11/2006 |
| JP | 2006-347863 A | 12/2006 |
| JP | 2007-053385 A | 3/2007 |
| JP | 2007-95845 A | 4/2007 |
| JP | 2007-200929 A | 8/2007 |
| JP | 2008-078275 A | 4/2008 |
| KR | 100638880 B1 | 10/2006 |
| KR | 20070105215 A | 10/2007 |

* cited by examiner

*Primary Examiner* — Mark Prenty
(74) *Attorney, Agent, or Firm* — Altis & Wispro Law Group, Inc.

(57) ABSTRACT

A photoelectric device having Group III nitride semiconductor includes a conductive layer, a metallic mirror layer located on the conductive layer, and a Group III nitride semiconductor layer located on the metallic mirror layer. The Group III nitride semiconductor layer defines a number of microstructures thereon. Each microstructure includes at least one angled face, and the angled face of each microstructure is a crystal face of the Group III nitride semiconductor layer.

12 Claims, 22 Drawing Sheets

PHOTOELECTRIC DEVICE HAVING GROUP III NITRIDE SEMICONDUCTOR

CROSS REFERENCE TO RELATED APPLICATIONS

This application is a continuation-in-part application of prior-filed U.S. patent application Ser. No. 12/852,746 filed Aug. 9, 2010, now abandoned, which is a divisional application of patent application Ser. No. 12/426,010 filed Apr. 17, 2009, now U.S. Pat. No. 7,824,942, which is based on and claims priority from Taiwan Patent Application No. 097115512 filed Apr. 28, 2008.

BACKGROUND OF THE DISCLOSURE

1. Field of the Disclosure

The present disclosure relates to a photoelectric device having Group III nitride semiconductor, and more particularly to the light emitting structure of a photoelectric device.

2. Description of the Related Art

Light emitting diodes of gallium nitride or other Group III nitride semiconductor materials are built upon a sapphire substrate mainly due to a high degree of lattice compatibility therebetween (although a buffer layer is still often required to improve the match). However, sapphire substrates have many disadvantages, such as high insulation characteristics, and due to such characteristics it is not easy to create a light emitting diode made of Group III nitride semiconductor material having a vertical conductive structure. Therefore, technology continues to advance and allow use of other substrate materials, such as silicon carbide, to reduce such disadvantages.

Due to its high conductivity, silicon carbide can be used to produce a conductive substrate. Moreover, due to its high stability, silicon carbide is becoming more important in such manufacturing processes. Although a Group III nitride semiconductor layer can be deposited on a silicon carbide substrate with the help of a buffer layer made of gallium nitride or aluminum gallium nitride, the degree of lattice match between a Group III nitride semiconductor material and silicon carbide is still lower than the degree of lattice match between aluminum gallium nitride and silicon carbide. The lattice mismatch often causes defects in an epitaxial layer even where the buffer layer is formed on a silicon carbide substrate. Furthermore, a silicon carbide substrate is more expensive than substrates made of other materials.

FIG. 1A and FIG. 1B show a method of separating a thin film from a growth substrate, disclosed in U.S. Pat. No. 6,071,795. The method initially forms a separation region 12 and a silicon nitride layer 13 on a sapphire substrate 11, and then a bonding layer 14 is disposed on the surface of the silicon nitride layer 13. Next, with the help of the bonding layer 14, a silicon substrate 15 is bonded to the sapphire substrate 11 with a stacked-layer structure. A laser beam penetrating the sapphire substrate 11 is directed at the separation region 12, generates decomposition thereof. Finally, the remnant material of the decomposed separation region 12 is cleared to obtain a composite including the silicon substrate 15 and the silicon nitride layer 13. However, because the bonding layer 14 between the silicon substrate 15 and the silicon nitride layer 13 is dielectric, the composite cannot be a basis for building a vertical structure light emitting diode. Moreover, if the material for the bonding layer 14 is disposed incorrectly or selected improperly, the bonding is affected, and defects are formed in the silicon nitride layer 13.

FIG. 2 shows a method of separating two layers of material from one another, disclosed in U.S. Pat. No. 6,740,604. The technology used for the disclosure related to FIG. 2 is similar to that for the disclosure related to FIG. 1A and FIG. 1B. A laser beam 23 is directed at the interface between a first semiconductor layer 21 and a second semiconductor layer 22, and initiates the decomposition of the second semiconductor layer 22 at the interface. Finally, the first semiconductor layer 21 is separated from the second semiconductor layer 22. The second semiconductor layer 22 can be the film layer formed on a substrate. In such process, a substrate replaces the first semiconductor layer 21, and then both are separated.

FIG. 3 shows a structure prior to separation of the substrate, disclosed in U.S. Pat. No. 6,746,889. The method initially grows several epitaxial layers, which include the first region 32 of a first conductivity type, a light-emitting p-n junction 33, and the second region 34 of a second conductivity type, on a substrate 31. Next, several scribe lines 36 are cut through the epitaxial layers of the first region 32, light-emitting p-n junction 33 and second region 34 to form multiple individual optoelectronic devices or dies 35 on the substrate 31. Thereafter, the second region 34 is bonded to a submount 37. As shown, a laser beam, in the same manner, penetrating the substrate 31 causes the substrate 31 to separate from the first region 32. Separated optoelectronic devices or dies 35 can be removed from the submount 37 and proceed through the packaging processes. Obviously, when the epitaxial layers are cut through, individual optoelectronic devices or dies 35 bonded to the submount 37 squeeze one another by external forces such that die cracks may occur.

FIG. 4 is a side view of the laser lift-off process for removing a sapphire substrate, disclosed in U.S. Pat. No. 6,617,261. A gallium nitride layer 42 is initially formed on a sapphire substrate 41, and then multiple grooves 44 are formed by etching process. Next, a silicon substrate 43 is bonded to the surface where the gallium nitride layer 42 is formed and then is etched to form the grooves 44. Thereafter, an ultraviolet excimer laser 45 emits a laser beam 46 to the sapphire substrate 41. The laser beam 46 penetrates the transparent sapphire substrate 41 to cause the gallium nitride to decompose at the interface so as to obtain a silicon substrate 43 bonded with the gallium nitride layer 42. Any residual gallium metal on the surface of the gallium nitride layer 42 is removed by hydrochloric acid. The gallium nitride layer 42 is finally cleaned for subsequent deposition processes.

Conventional technologies use high-energy laser beams to separate substrates or light emitting dies. However, those technologies have low throughput and require expensive equipment. Therefore, a separation technology guaranteeing the quality of produced light emitting dies, and can be applied to mass production with acceptable throughput and minimized cost is required.

BRIEF DESCRIPTION OF THE DRAWINGS

The disclosure will be described according to the appended drawings in which.

DETAILED DESCRIPTION OF THE DISCLOSURE

Figure 1A:
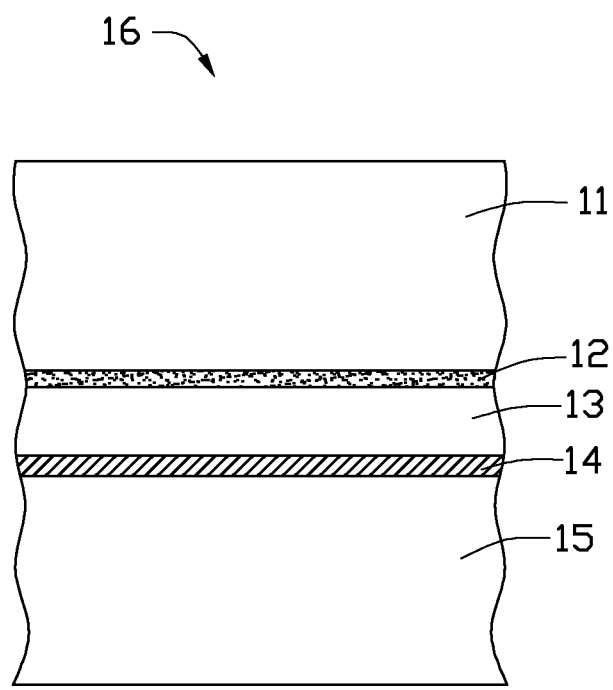
FIGS. 1A and 1B show a method of separating a thin film from a growth substrate, disclosed in U.S. Pat. No. 6,071,795.
Figure 1B:
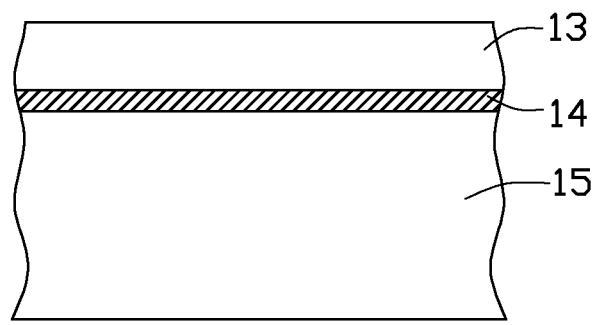
Figure 2:
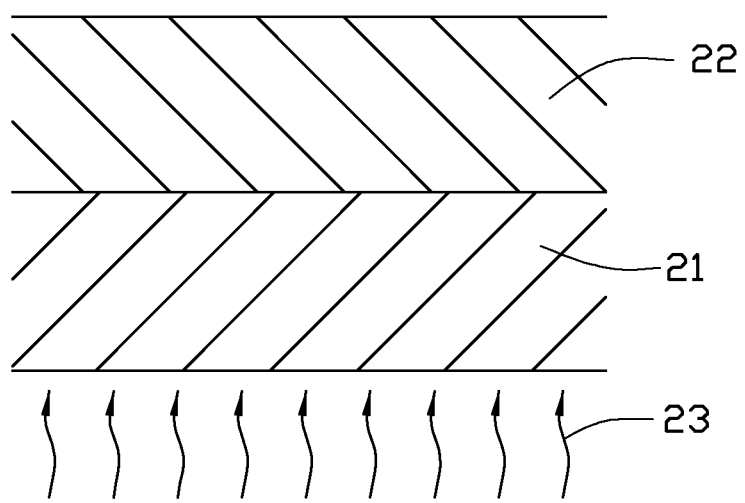
FIG. 2 shows a method of separating two layers of material from one another, disclosed in U.S. Pat. No. 6,740,604.
Figure 3:
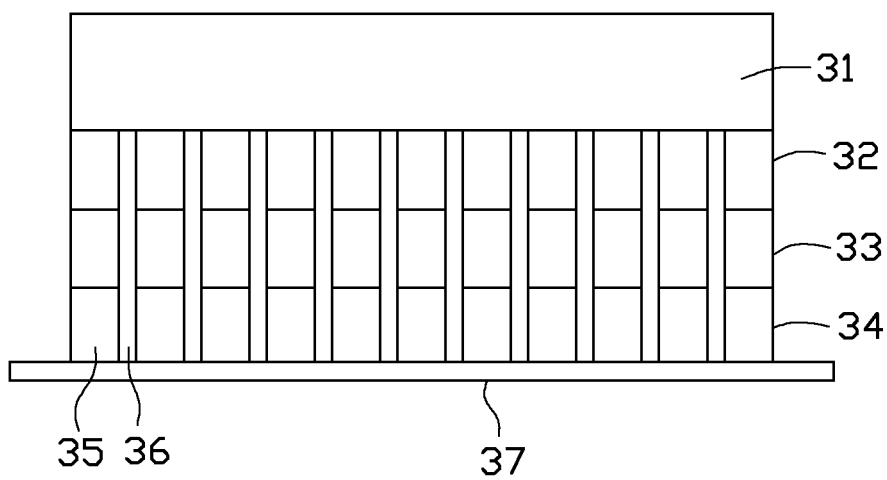
FIG. 3 shows a structure before a substrate is separated, disclosed in U.S. Pat. No. 6,746,889.
Figure 4:
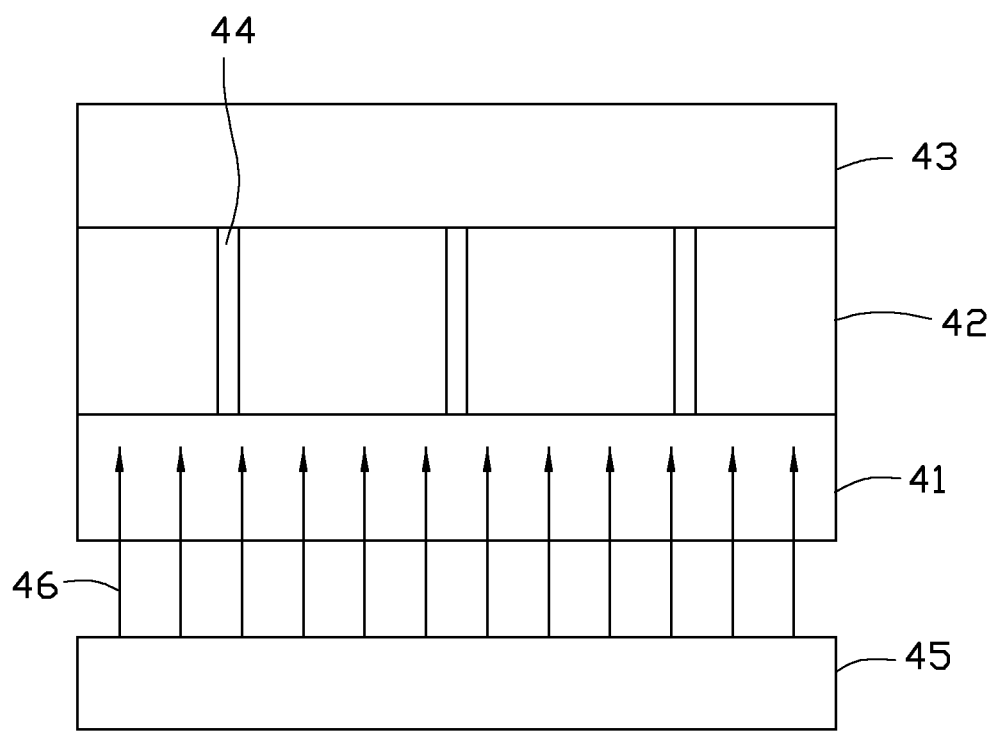
FIG. 4 is a side view of the laser lift-off process for removing a sapphire substrate, disclosed in U.S. Pat. No. 6,617,261.
Figure 5:
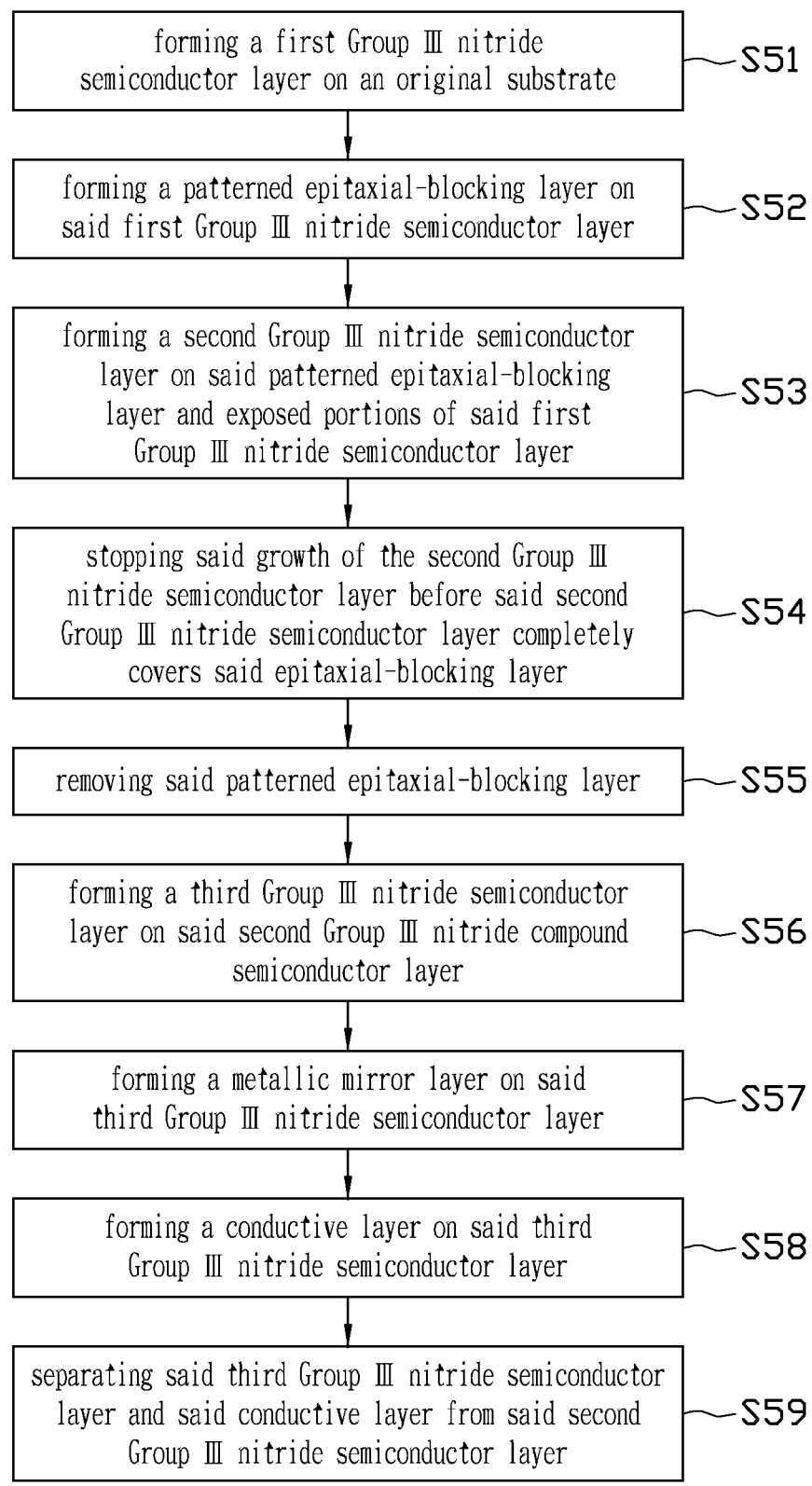
FIG. 5 is a flowchart showing a process for fabricating a photoelectric device having Group III nitride semiconductor according to one embodiment of the present disclosure.

FIG. 5 is a flowchart showing a process for fabricating a photoelectric device having Group III nitride semiconductor according to one embodiment of the present disclosure. In Step S51, a first Group III nitride semiconductor layer is formed on a surface of a original substrate, such as a sapphire substrate (i.e. aluminum oxide, $Al_2O_3$), silicon carbide (SiC) substrate, silicon substrate, zinc oxide (ZnO) substrate, magnesium oxide (MgO) substrate, gallium arsenide (GaAs) substrate, etc.

In Step S52, photolithography and etching form a patterned epitaxial-blocking layer on the first Group III nitride semiconductor layer, such as a patterned silicon oxide. That is, the epitaxial-blocking layer with a default pattern covers partial surfaces of the first Group III nitride semiconductor layer.

As shown in Step S53, a second Group III nitride semiconductor layer is subsequently grown on the epitaxial-blocking layer and the exposed portions of the first Group III nitride semiconductor layer. Before the second Group III nitride semiconductor layer completely covers the epitaxial-blocking layer, the growth of the second Group III nitride semiconductor layer is stopped. Next, the epitaxial-blocking layer is removed, as shown in Step S54 and S55.

In Step S56, a third Group III nitride semiconductor layer is grown on the second Group III nitride semiconductor layer. Next, a metallic mirror layer is formed on the third Group III nitride semiconductor layer, as shown in Step S57. The metallic mirror layer can reflect the light emitted from the third Group III nitride semiconductor layer.

As shown in Step S58, a conductive material is deposited on the third Group III nitride semiconductor layer, for example by electroplating, composite electroplating, or bonding to deposit copper (Cu), nickel (Ni), copper tungsten alloy (CuW), silicon (Si), or silicon carbide (SiC) so that the light emitting diode has a vertical conductive structure.

As shown in Step S59, a photoelectric device having Group III nitride semiconductor with a single vertical conductive structure is obtained by releasing the combination of the third Group III nitride semiconductor layer and the conductive layer from the second Group III nitride semiconductor layer. The second Group III nitride semiconductor layer can be decomposed by etching.

Figure 6A:
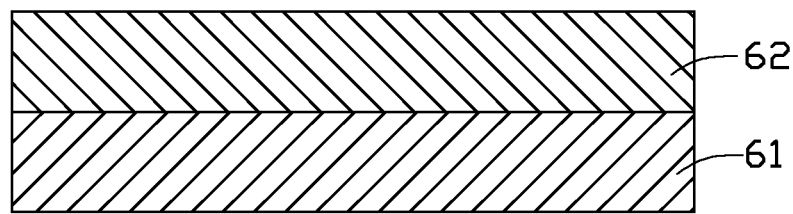
FIGS. 6A-6I are schematic diagrams illustrating a process for fabricating a photoelectric device having Group III nitride semiconductor according to one embodiment of the present disclosure.
Figure 6B:
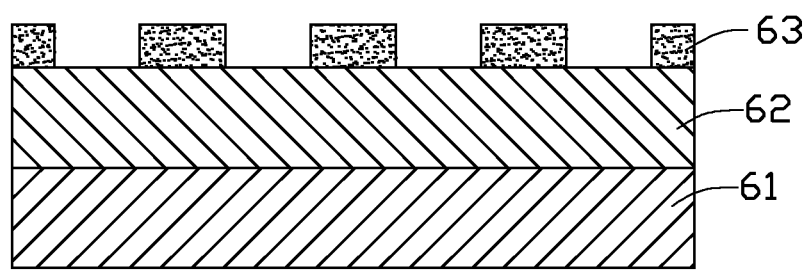
Figure 6C:
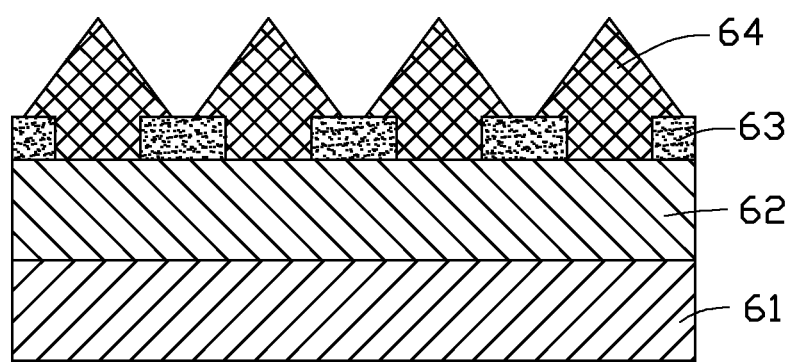

FIGS. 6A-6J are schematic diagrams illustrating a process for fabricating a photoelectric device having Group III nitride semiconductor according to one embodiment of the present disclosure. As shown in FIG. 6A, a first Group III nitride semiconductor layer 62 is formed on the surface of an original substrate 61. As shown in FIG. 6B, a patterned epitaxial-blocking layer 63 is formed on the first Group III nitride semiconductor layer 62. As shown in FIG. 6C, a second Group III nitride semiconductor layer 64 is formed on the epitaxial-blocking layer 63 and the surface of the first Group III nitride semiconductor layer 62 not covered by the epitaxial-blocking layer 63. The second Group III nitride semiconductor layer 64 is laterally overgrown on the portion of the surface of the first Group III nitride semiconductor layer 62 where the epitaxial-blocking layer 63 does not cover from the middle of each of the openings. Threading dislocation is thus minimized. Furthermore, the direction of a threading dislocation defect occurring in the second Group III nitride semiconductor layer 64 located in the opening is redirected to extend parallel along the surface of the original substrate 61. This threading dislocation defect will meet another defect propagating in an opposite direction so that the density of vertical threading dislocation is reduced.

Figure 6D:
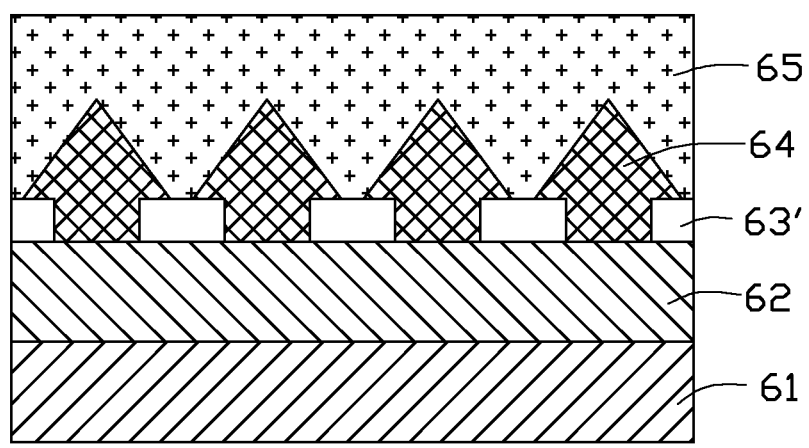
Figure 6E:
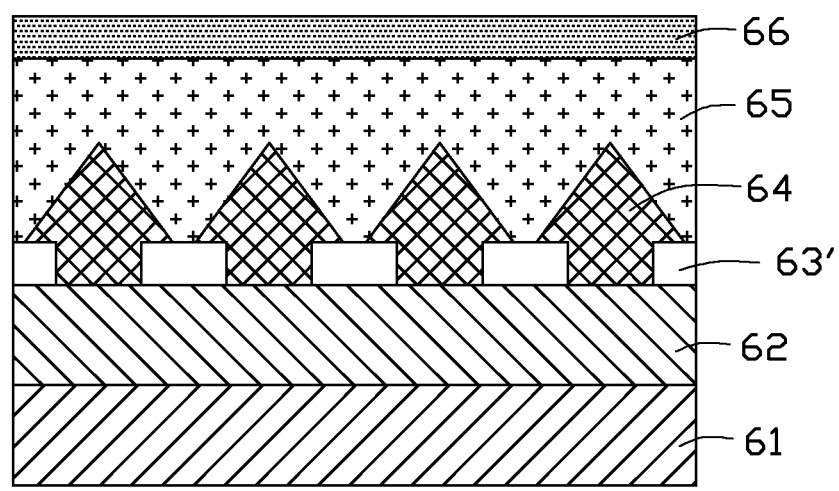

As shown in FIG. 6D, the epitaxial-blocking layer 63 is removed by etching, and grooves 63' appear. Consequently, the mushroom-blocks or mushroom-strips of the second Group III nitride semiconductor layer 64 are erected on the first Group III nitride semiconductor layer 62. Afterward, a third Group III nitride semiconductor layer 65 is formed on the mushroom-blocks or mushroom-strips of the second Group III nitride semiconductor layer 64. The third Group III nitride semiconductor layer 65 is laterally grown from the sides of each of the mushroom members of the second Group III nitride semiconductor layer 64 until the separate segments from each mushroom member join into one layer. As shown in FIG. 6E, a metallic mirror layer 66 is formed on the third Group III nitride semiconductor layer 65.

Figure 6F:
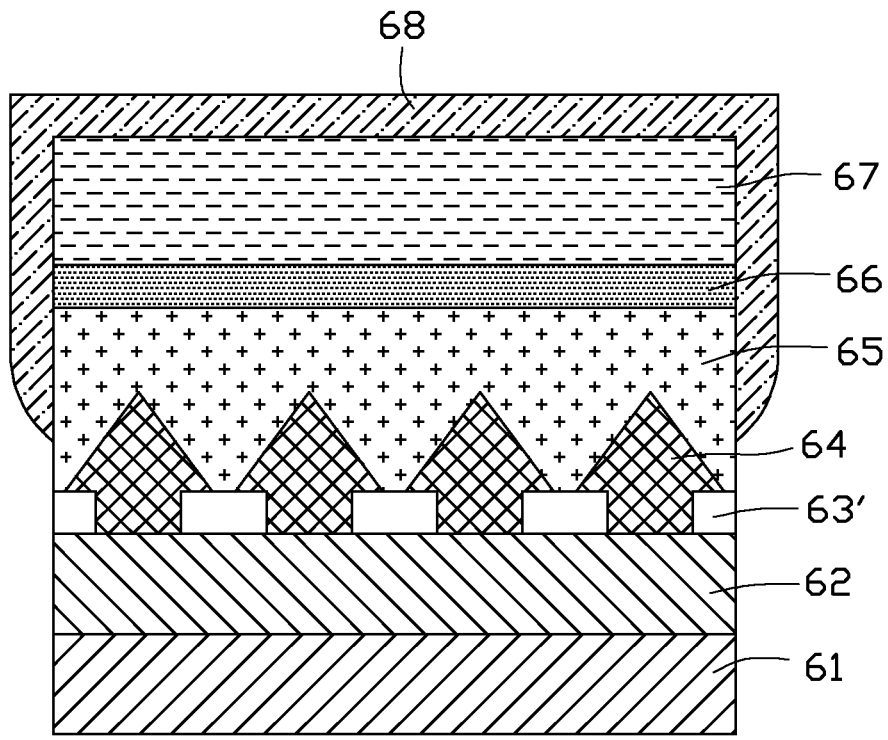

As shown in FIG. 6F, a conductive layer 67 is deposited on or adhered to the metallic mirror layer 66, such as copper (Cu), nickel (Ni), copper tungsten alloy (CuW), silicon (Si), or silicon carbide (SiC), by electroplating, composite electroplating, or bonding. In addition to excellent electrical conductivity, the conductive layer 67 can also improve heat conductivity. An etching protection layer 68, such as a silicon dioxide ($SiO_2$) layer, is deposited, to protect the conductive layer 67 and the mirror metal layer 66 from the corrosion of the etchant. Under the protection of the etching protection layer 68, the conductive layer 67 and the mirror metal layer 66 will not be exposed to the etchant so as to avoid damage.

Figure 6G:
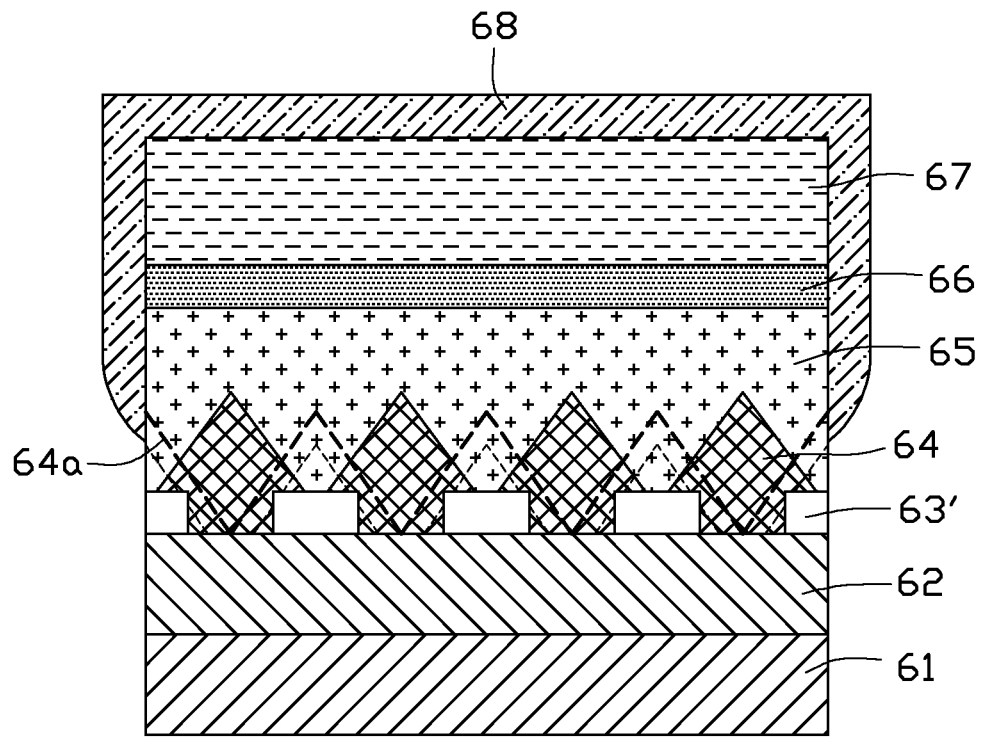
Figure 6H:
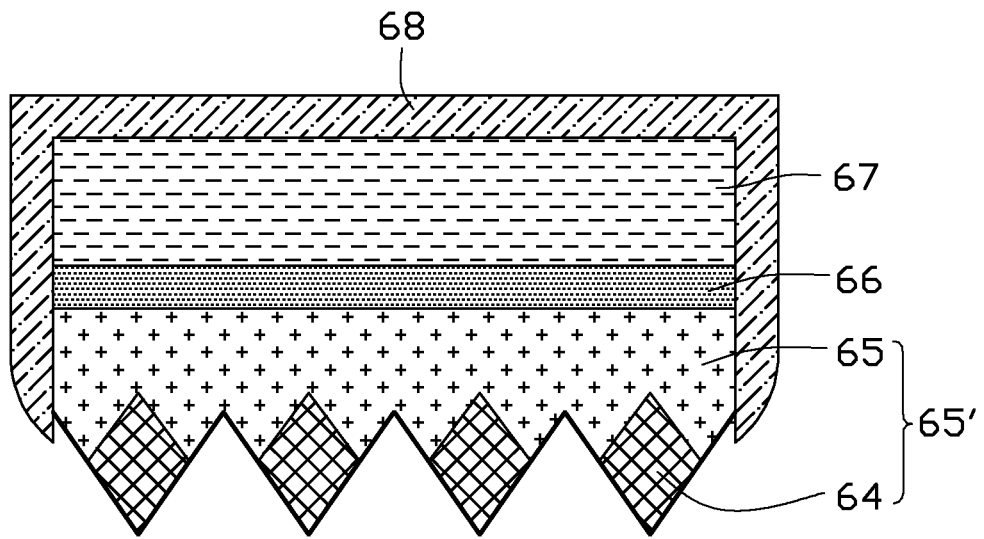

As shown in FIG. 6G and FIG. 6H, the etchant is consequently brought into the grooves 63' of the second Group III nitride semiconductor layer 64 so that parts of the second Group III nitride semiconductor layer 64 and parts of the third Group III nitride semiconductor layer 65 are decomposed. Thus, a treated Group III nitride semiconductor layer 65' and the layers stacked on the layer 65' are obtained as shown in FIG. 6H, which are released from the pre-formed base including the original substrate 61, the first Group III nitride semiconductor layer 62 and the remaining second and third Group III nitride semiconductor layers 64 and 65 on the first Group III nitride semiconductor layer 62. The treated Group III nitride semiconductor layer 65' mainly include a part of the third Group III nitride semiconductor layer 65, and parts of the second Group III nitride semiconductor layer 64 remaining on the released third Group III nitride semiconductor layer 65.

The etchant may etch the crystal structure along the crystal faces thereof which are the looser portions in the crystal structure. In the Group III nitride semiconductor, the crystal faces are angled relative to its grown direction and the underlying layers. The angled faces 64a shown in FIG. 6G are the crystal faces in the crystal structure, and the etchant may etch the crystal structure from grooves 63' along the angled faces 64a of the second Group III nitride semiconductor layer 64 until the treated Group III nitride semiconductor layer 65' is released. Thus, the included angle between the angled faces 64a and the metallic mirror layer 66 may be in a range from about 58° to 62°, such as 58° in a gallium nitride layer in this embodiment. It is noted that the included angle between the angled faces 64a and the metallic mirror layer 66 may be adjusted according to the etching parameters and structure of the second Group III nitride semiconductor layer 64. For example, the included angle therebetween may be in a range from about 46° to 47° if the etchant is phosphoric acid solution. Accordingly, the separating surface from which the treated Group III nitride semiconductor layer 65' is released occurs in both the second and the third Group III nitride semiconductor layer 64 and 65.

Figure 6I:
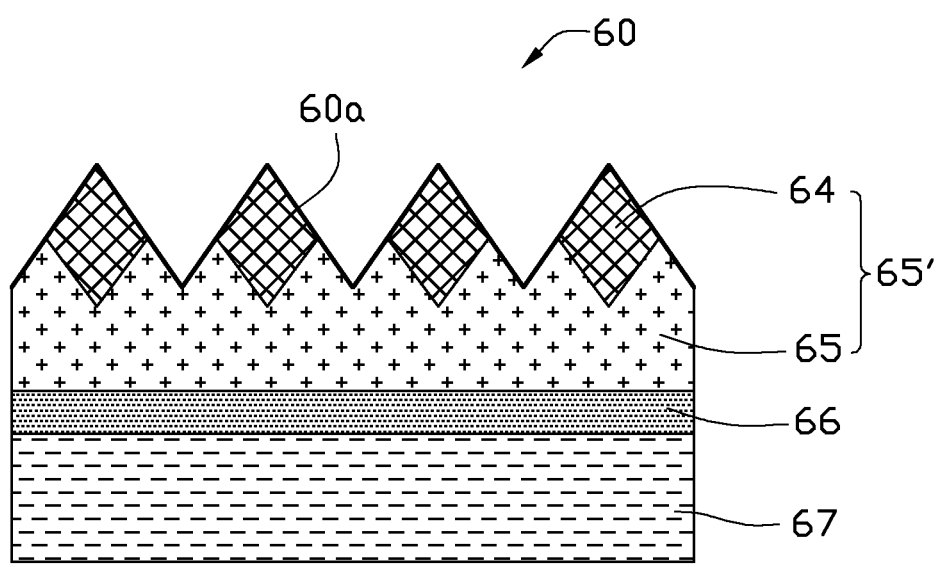
Figure 6J:
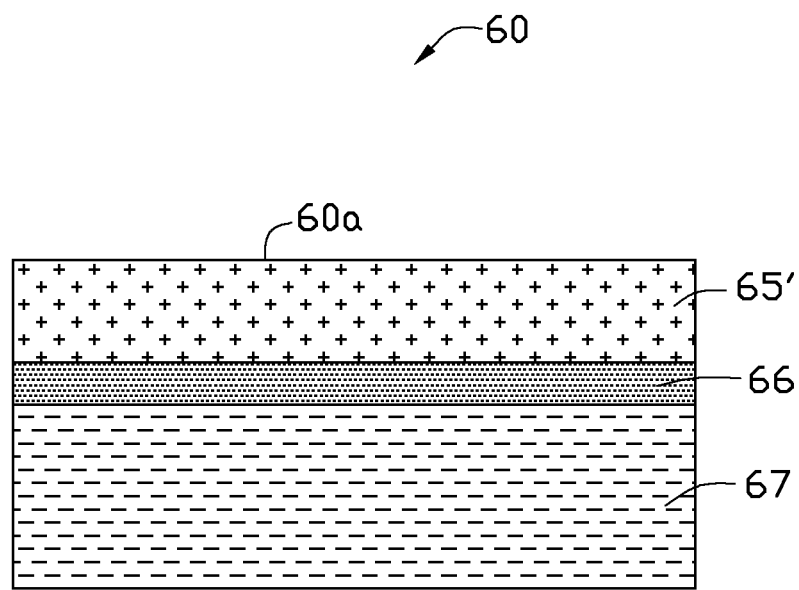
FIG. 6J is a macroscopic view of the photoelectric device of FIG. 6I.

Next, as shown in FIG. 6I and FIG. 6J, the etching protection layer 68 is removed so as to obtain a photoelectric device 60, of Group III nitride semiconductor and with a vertical conductive structure. In the microcosmic view of the photoelectric device 60, a light emitting surface 60a of the photoelectric device 60, which has been etched through the grooves 63' and along the angled faces 64a, is a rough surface defining multiple microstructures thereon. Positions of the microstructures are corresponding to those of the grooves 63'. The pitch and number of the microstructures are the same as the pitch and number of the grooves 63'. For example, the pitch of the microstructures is substantially 3 μm in this embodiment, but is not limited thereto. These microstructures can change the light emitting direction and increase the light extraction efficiency of the photoelectric device 60.

In FIG. 6G through 6I, the microstructures of the surface 60a are triangular prisms, which may include a vertex angle about 64°. However, the shape of the microstructures is not limited thereto. For example, fine cracks may happen in the third Group III nitride semiconductor layer 65 or the second Group III nitride semiconductor layer 64 when the treated Group III nitride semiconductor layer 65' and the first Group III nitride semiconductor layer 62 are about to be separated. Thus, the treated Group III nitride semiconductor layer 65' is released by the fine cracks, and the microstructures of the surface 60a are trapezoid prisms. The shape of the microstructures can be controlled by the patterns of the patterned epitaxial-blocking layers 63. In FIG. 6J, the surface 60a of the photoelectric device 60 exhibits substantial flatness in the macroscopic view.

Composition of metallic mirror layer 66 depends on the package type of the photoelectric device for reflecting light. The material of the second Group III nitride semiconductor layer 64 and the third Group III nitride semiconductor layer 65 is $Al_xIn_yGa_{1-x-y}N$, wherein $0 \leq x \leq 1$ and $0 \leq y \leq 1$, and such material helps the deposition of the silicon doped N-type gallium nitride layer. The third Group III nitride semiconductor layer 65 can include a light emitting structure, and specifically can include an N-type semiconductor layer, an active layer (light emitting layer), and a P-type semiconductor layer, or a light emitting structure can be further formed between the third Group III nitride semiconductor layer 65 and the metallic mirror layer 66.

Figure 7A:
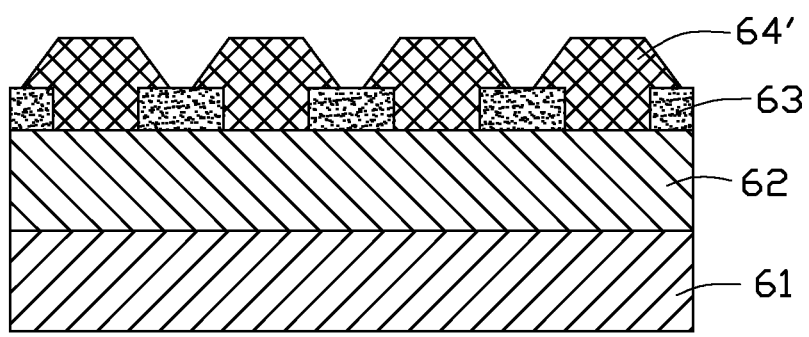
FIGS. 7A and 7B are schematic diagrams illustrating a process for fabricating a photoelectric device having Group III nitride semiconductor according to another embodiment of the present disclosure.
Figure 7B:
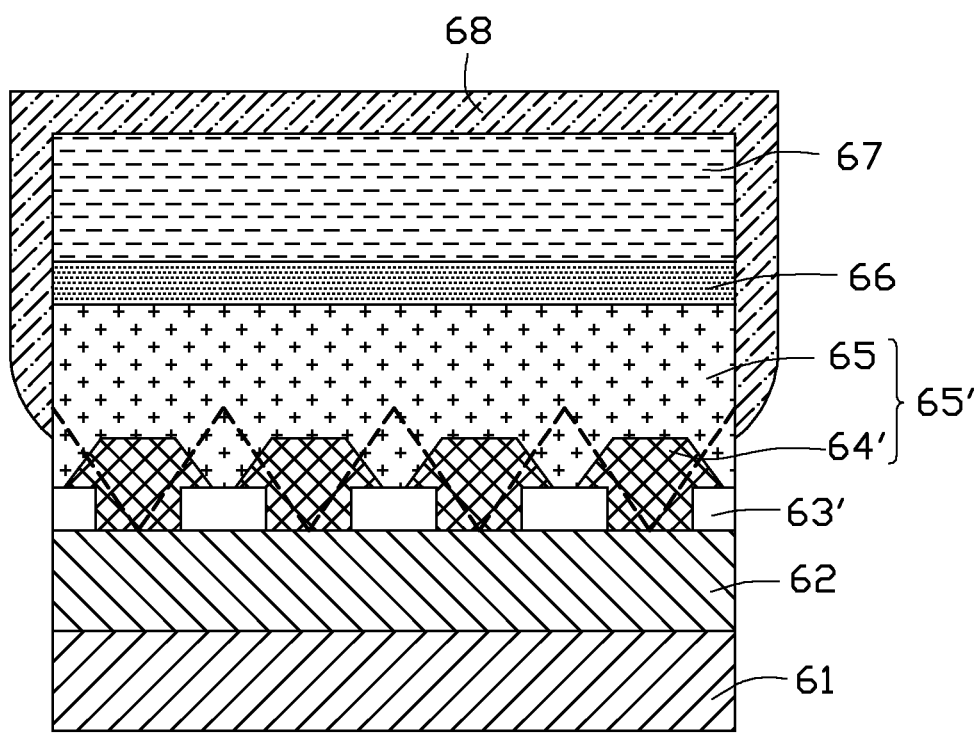

The profile of each of the mushroom blocks or the mushroom strips can be changed by controlling growth conditions of the second Group III nitride semiconductor layer 64 such as the flow rate of the elements of Group III nitride, temperature and time. Compared with FIG. 6C, the second Group III nitride semiconductor layer 64' in FIG. 7A has flat tops rather than sharp tops. Similarly, after the epitaxial-blocking layer 63 is removed, the third Group III nitride semiconductor layer 65, metallic mirror layer 66 and etching protection layer 68 are sequentially formed, as shown in FIG. 7B. The treated Group III nitride semiconductor layer 65' and the layers stacked on the layer 65 are released from the second Group III nitride semiconductor layer 62 by wet etching. Furthermore, the etching protection layer 68 is removed so as to obtain a vertical photoelectric device having Group III nitride semiconductor.

Figure 8A:
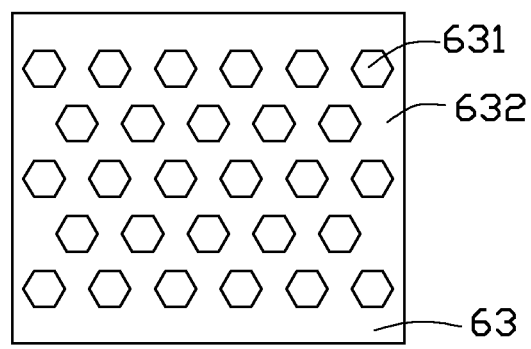
FIGS. 8A-8D are schematic diagrams illustrating patterned epitaxial-blocking layers according to embodiments of the present disclosure.
Figure 8B:
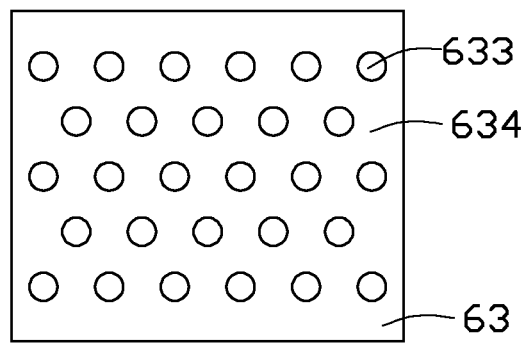
Figure 8C:
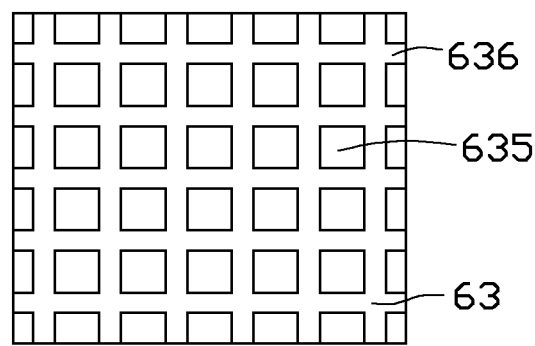
Figure 8D:
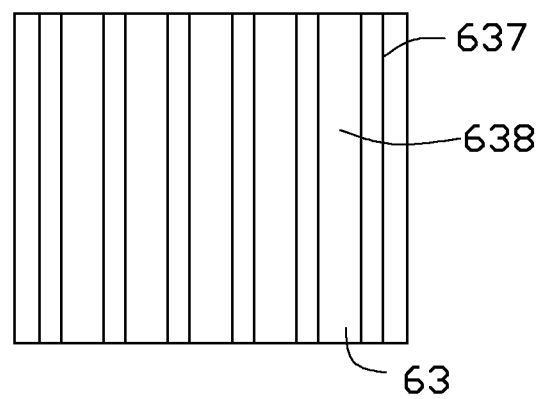

FIGS. 8A-8D are schematic diagrams illustrating patterned epitaxial-blocking layers according to embodiments of the present disclosure. As shown in FIG. 8A, the epitaxial-blocking layer 63 has multiple hexagonal cylinders 631 and multiple grooves 632 connected together. As shown in FIG. 8B, the epitaxial-blocking layer 63 has multiple circular cylinders 633 and multiple grooves 634 connected together. As shown in FIG. 8C, the epitaxial-blocking layer 63 has multiple rectangular cylinders 635 and multiple grooves 636 connected together. As shown in FIG. 8D, the epitaxial-blocking layer 63 has multiple convexes 637 and multiple grooves 628 separating the convexes 627, and the convex 627 can have a longitudinal shape.

The described embodiments of the present disclosure are intended to be illustrative only. Numerous alternative embodiments may be devised by persons skilled in the art without departing from the scope of the following claims.

What is claimed is:

1. A photoelectric device having a Group III nitride semiconductor, comprising:
    a conductive layer;
    a metallic mirror layer located on the conductive layer; and
    a Group III nitride semiconductor layer located on the metallic mirror layer, the Group III nitride semiconductor layer defining a plurality of angled faces on a surface opposite to the metallic mirror layer, the angled faces being angled relative to the metallic mirror layer for increasing light extraction efficiency of the photoelectric device;
    wherein an included angle between the plurality of angled faces and the metallic mirror layer is substantially in a range from 58° to 62°.

2. The photoelectric device having the Group III nitride semiconductor of claim 1, wherein the angled faces are a plurality of crystal faces of the Group III nitride semiconductor layer.

3. The photoelectric device having the Group III nitride semiconductor of claim 1, wherein the plurality of angled faces form a plurality of triangular prisms.

4. The photoelectric device having the Group III nitride semiconductor of claim 3, wherein a pitch of the plurality of triangular prisms is substantially 3 μm.

5. The photoelectric device having the Group III nitride semiconductor of claim 3, wherein a vertex angle of each of the plurality of triangular prisms is substantially in a range from 64° to 56°.

6. The photoelectric device having the Group III nitride semiconductor of claim 1, wherein the plurality of angled faces form a plurality of trapezoid prisms.

7. The photoelectric device having the Group III nitride semiconductor of claim 1, wherein the material of the Group III nitride semiconductor layer is $Al_xIn_yGa_{1-x-y}N$, wherein $0 \leq x \leq 1$ and $0 \leq y \leq 1$.

8. The photoelectric device having the Group III nitride semiconductor of claim 1, wherein the conductive layer is formed by electroplating, composite electroplating, or bonding copper (Cu), nickel (Ni), copper tungsten alloy (CuW), silicon (Si), or silicon carbide (SiC).

9. The photoelectric device having the Group III nitride semiconductor of claim 1, further comprising an N-type semiconductor layer, an active layer, and a P-type semiconductor layer formed between the Group III nitride semiconductor layer and the metallic mirror layer.

10. The photoelectric device having the Group III nitride semiconductor of claim 1, wherein the Group III nitride semiconductor layer comprises an N-type semiconductor layer, an active layer, and a P-type semiconductor layer.

11. A photoelectric device having a Group III nitride semiconductor, comprising:
   a conductive layer;
   a metallic mirror layer located on the conductive layer; and
   a Group III nitride semiconductor layer located on the metallic mirror layer, the Group III nitride semiconductor layer defining a plurality of angled faces on a surface opposite to the metallic mirror layer, the angled faces being angled relative to the metallic mirror layer for increasing light extraction efficiency of the photoelectric device;
   wherein the plurality of angled faces form a plurality of trapezoid prisms.

12. A photoelectric device having a Group III nitride semiconductor, comprising:
   a conductive layer;
   a metallic mirror layer located on the conductive layer;
   a Group III nitride semiconductor layer located on the metallic mirror layer, the Group III nitride semiconductor layer defining a plurality of angled faces on a surface opposite to the metallic mirror layer, the angled faces being angled relative to the metallic mirror layer for increasing light extraction efficiency of the photoelectric device; and
   an N-type semiconductor layer, an active layer, and a P-type semiconductor layer formed between the Group III nitride semiconductor layer and the metallic mirror layer.

* * * * *